United States Patent [19]

Sanchez et al.

[11] Patent Number: 5,628,850
[45] Date of Patent: May 13, 1997

[54] METHOD FOR PRODUCING INPUT/OUTPUT CONNECTIONS IN A CERAMIC DEVICE

[75] Inventors: Carlos A. Sanchez, Belen; Rong-Fong Huang, Albuquerque; Michael W. Murphy, Placitas, all of N.M.

[73] Assignee: Motorola, Inc., Schaumburg, Ill.

[21] Appl. No.: 504,973

[22] Filed: Jul. 20, 1995

[51] Int. Cl.$^6$ ............................ B32B 31/18; B32B 31/20
[52] U.S. Cl. ........................ 156/89; 156/252; 156/253; 156/268; 419/7
[58] Field of Search ......................... 156/89, 252, 268, 156/253; 264/61, 66, 67; 179/261, 262; 257/691

[56] References Cited

U.S. PATENT DOCUMENTS 5,242,867 9/1993 Lin et al. .
5,276,963 1/1994 Flanders .................... 264/61 X Primary Examiner—James Engel
Assistant Examiner—M. Curtis Mayes
Attorney, Agent, or Firm—Gary J. Cunningham; Brian M. Mancini

[57] ABSTRACT

A method for producing input/output connections in a ceramic device is disclosed. The ceramic device can provide wraparound input/output connections. The method can include first providing first and second green ceramic layers, forming at least one via in each ceramic layer, the at least one via in the second layer being offset from and connecting to the via in the first ceramic layer, filling the vias with metallization, laminating the ceramic layers to form a laminate, scoring the laminate along at least one line extending through the first via and into a portion of the second ceramic layer such that the line does not intersect the at least one second via the ceramic laminate and metalization, and cleaving the laminate along the scored line. A ceramic device using this method can provide a wraparound connection extending partially up the side thereof, which can be advantageous in many multi-layer applications.

7 Claims, 3 Drawing Sheets

202

204

206

208

METHOD FOR PRODUCING INPUT/ OUTPUT CONNECTIONS IN A CERAMIC DEVICE

FIELD OF THE INVENTION

The present invention relates generally to multilayer ceramic devices used in radio frequency applications and, in particular, to method for producing input/output connections in a ceramic device and apparatus produced thereby.

BACKGROUND OF THE INVENTION

Multilayer ceramic devices are known to include many various radio frequency (RF) packaging and devices. These multilayer ceramic devices are commonly found in electronic communication devices such as, cellular phones, two-way radios and wireless data devices. Some specific uses for multilayer ceramic devices may be found in transceiver antenna switches, voltage controlled oscillator modules and RF front end modules. Each of these applications requires side or bottom input/output (IO) pads on the multilayer ceramic in order to provide connections from the multilayer ceramic to a printed circuit (PC) board of the communication device.

Typically these IO pads are configured to form side metalization on the four or more vertical sides of a chip-shaped multilayer ceramic device along with contiguous bottom IO pads on the bottom portion of the ceramic device. Side metalization is used on the ceramic device to provide visibly reliable and mechanically robust solder connections when the device is surface mounted on a PC board. Upon reflowing, the solder can wick up the side metalization to provide a more reliable electrical and mechanical connection. Several methods have been developed to provide the side metalization for a wraparound electrical connection.

As shown in FIG. 1, one method is to use screen printing to paint a side connection trace 16 from an existing bottom trace 14 of a ceramic device 10 up a respective diced side 12 of the ceramic device 10 after the individual ceramic device 10 has been diced from a fired ceramic substrate array. This screen printing method is used because the process of dicing the individual ceramic devices exposes bulk non-metalized ceramic on the sides of each device. Many processing steps are involved in this method and many problems are observed. For example, each ceramic device is diced from a wafer array which means that wafer scale testing is not possible since side metalization is not available until after dicing. In addition the dicing process is very time consuming. Further, the side printing process is labor intensive because the individual diced ceramic devices have to be stacked and carefully aligned manually for screen printing.

As shown in FIG. 2 and 2A, another method to provide side metalization is to locate metal solid-filled vias 22 along singulation edges 24 of ceramic devices 20 in a ceramic array substrate 26 before firing (green state of the ceramic). Lines (shown as 24 in FIG. 2) are scribed in the substrate 26 along the vias 22 before firing to facilitate later singulation. After firing, each ceramic device is singulated from its substrate along the scribe lines 24 in the solid-filled vias 22 (shown in FIG. 2A). The subsequent split vias 28 serve as side connections 30 for each ceramic device 20. However, in this configuration individual device testing is not possible while in the array form since vias 22 are being shared between devices 20 until after they are singulated. This method disadvantageously does not allow for testing of individual devices while they are in the substrate array. Additionally, a clean splitting of the solid vias 22 can not be achieved reliably due to the mechanical strength difference between the ceramic and metal of the via. As a result, cracking occurs between the ceramic-metal interface of the via during the singulation action. Also, the surface of the side metalization tends to be very rough due to uneven pull-outs of the metal during singulation.

There is a need for a new method to provide reliable side input/output connections on a ceramic device, which: permits the use of array processing; allows testing of individual ceramic devices while in a substrate array form; utilizes conventional processing techniques; does not require a time consuming dicing operation; and provides a dimensionally uniform surface on the side metalization.

Accordingly, a ceramic device utilizing partial vias which have been scribed substantially therethrough while in the unfired green state would be an improvement over the prior art. A method which achieves reliable side metalization without requiring individualization of parts from their parent ceramic substrate array would also be an improvement over the art.

BRIEF DESCRIPTION OF THE DRAWINGS

FIG. 2 shows a cross-sectional view of a prior art ceramic device which has been scribed along vias before firing the ceramic substrate;

FIG. 3 shows a cross-sectional view of a first and second ceramic layer of the ceramic device, in accordance with the present invention;

FIG. 4 shows a cross-sectional view of a first and a second ceramic layer of the ceramic device after providing a via in the first layer, in accordance with the present invention;

FIG. 5 shows a cross-sectional view of the first and second ceramic layers of the ceramic device after substantially filling the via in the first layer with a metal paste, in accordance with the present invention;

FIG. 6 shows a cross-sectional view of the first and second ceramic layers of the ceramic device after laminating the layers together, in accordance with the present invention;

FIG. 7 shows a cross-sectional view of the ceramic layers of the ceramic device after scribing a line substantially through the via in the first layer and partially through a second layer before firing, in accordance with the present invention;

FIG. 8 shows a perspective view of singulated ceramic devices after firing and cleaving the via to form split vias, in accordance with the present invention;

DETAILED DESCRIPTION OF THE PREFERRED EMBODIMENT

Figure 8:
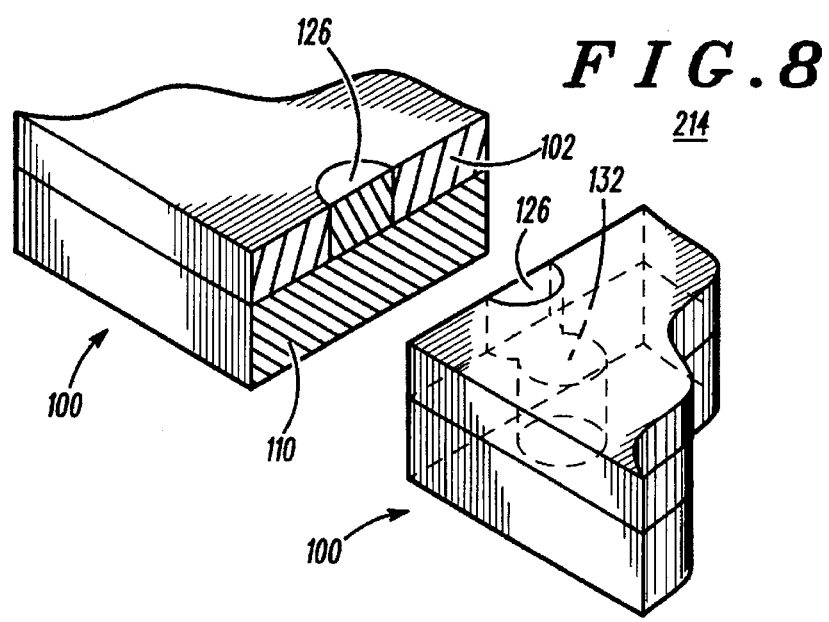

The present invention provides a device and method for producing input/output (IO) connections in a ceramic device. Referring to FIG. 8, a wraparound IO connection is formed from a partial via in a ceramic substrate which is cleaved to expose side metalization on each singulated ceramic device. The ceramic substrate may be of a single ceramic layer or a plurality of ceramic layers. In a preferred embodiment, the ceramic substrate includes at least two ceramic layers.

According to the present invention, the ceramic layers are preferably formed by commonly known ceramic tape casting processes. For example, the ceramic layers can be DuPont 951 ceramic tape (available from E.I. DuPont de Nemours and Company of Wilmington, Del., under the generic references of "green tap" or "ceramic tape"). As should be understood by those skilled in the art, the "green" terminology as used herein, solely refers to the fact that the tape is in an unfired state.

It should also be understood, that various methods of forming ceramic layers may be utilized, such as, but not limited to, molding, injecting, extruding, forming and roll compacting. It should also be understood that other ceramic materials may be utilized, such as alumina, glass, glass/ceramic composites, aluminum nitride, beryllium oxide, ferrite, cordierite, forsterite and mullite. In a preferred embodiment, a low sintering temperature glass/ceramic composition such as DuPont 951 ceramic tape (available from E.I. DuPont de Nemours and Company of Wilmington, Del.) is used. This has the advantages of having more controllable thermal expansion properties than high temperature ceramic tapes and the ability to cofire the composition along with high conductivity metalization (such as silver) thereon.

Figure 11:
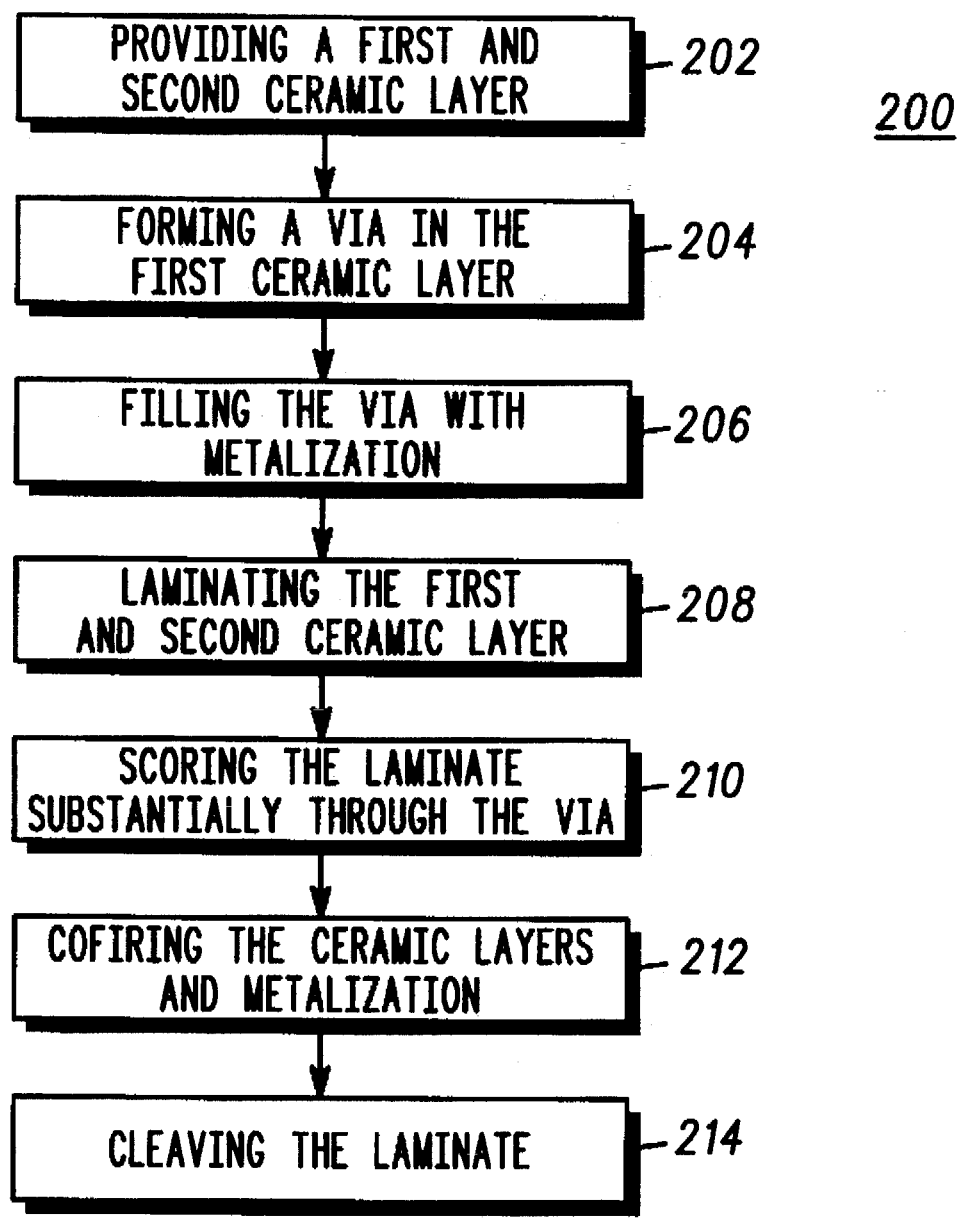
FIG. 11 shows a process flow block diagram of a method of producing input/output connections in a ceramic device, in accordance with the present invention.

In its simplest form (in FIG. 11), a method for producing input/output connections in a ceramic device and apparatus produced thereby is disclosed. The ceramic device can provide wraparound input/output connections. The method 200 can include first providing a plurality of ceramic layers 202 forming a via in at least one of the ceramic layers 204, filling the via with metalization 206, laminating the ceramic layers to from a multilayer ceramic laminate 208, scoring the laminate with lines that extend substantially through the via 210, cofiring the ceramic laminate and metalization 212, and cleaving the laminate along the scored line 214. A ceramic device using this method can provide a wraparound connection extending partially up the side thereof, which can be advantageous in many multi-layer applications.

Figure 1:
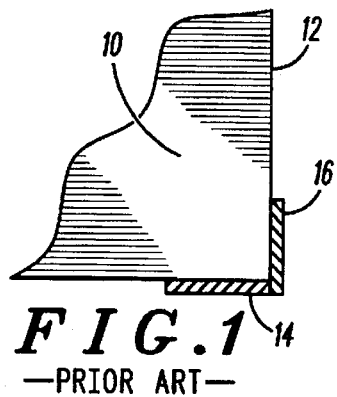
FIG. 1 shows a cross-sectional view of a prior art ceramic device which utilizes screen printing to provide a side connection.
Figure 2A:
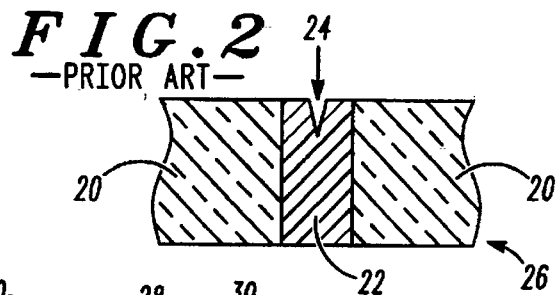
FIG. 2A shows a perspective view of the prior art ceramic device (as shown in FIG. 2) after firing of the ceramic substrate and singulation into individual ceramic devices.
Figure 2A:
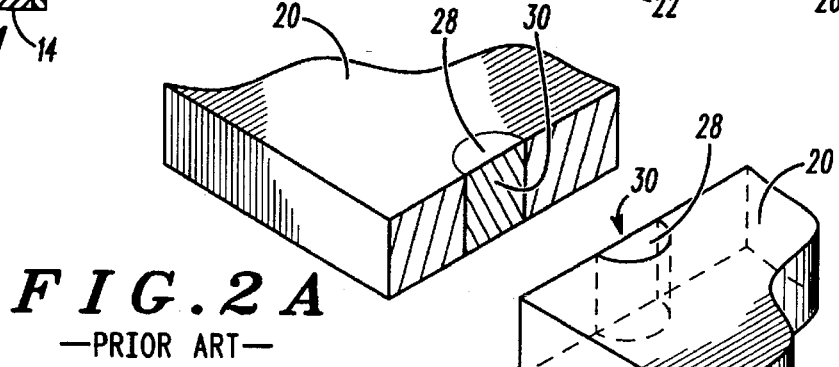
Figure 3:
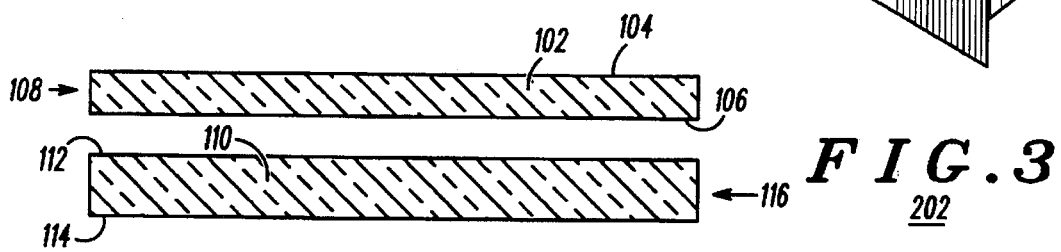
FIGS. 3–8 show various stages in connection with a method of producing input/output connections in a ceramic device, in accordance with the present invention.

Referring to FIGS. 3 through 8 and FIG. 11, a method 200 of producing input/output connections in a ceramic device 100 is shown. Generally, a first major step 202 includes providing at least one ceramic layer in a green state. However, providing a plurality of ceramic layers is preferred. Utilizing multiple layers has the advantage of allowing vias to be formed completely through at least one of the layers. In a preferred embodiment, at least two ceramic layers are provided. The layers may be chosen to have any thickness. In FIG. 3, a first ceramic layer 102 with an upper surface 104 and a lower surface 106 defining a predetermined thickness 108 of about equal to or less than a predetermined height 116 defined by a top 112 and bottom surface 114 of a second ceramic layer 110 is shown. More particularly, the first ceramic layer 102 is chosen to have a thickness 108 of about 0.005" (inches) and the second ceramic layer 110 is chosen to have a height 116 of about 0.010". This ratio between layers has the advantage of providing a first layer 102 that may be fully scored therethrough during subsequent processing while leaving sufficient substrate integrity for robust handling and processing.

It should be recognized that a single ceramic layer may be provided. However, the processing of a single layer in accordance with the present invention would require the formation of a partial or blind via in a very thin ceramic layer. This type of process, although realizable, might be difficult to practice or not be particularly cost effective with present technology.

Figure 4:
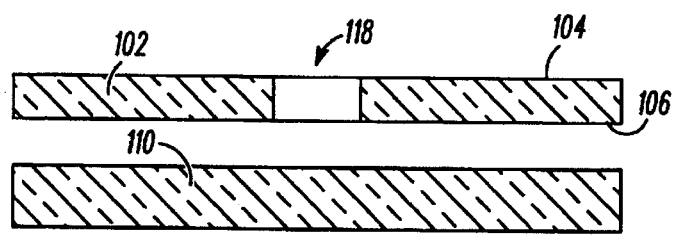

In FIG. 4, the next major process step 204 provides for the forming of a hole or via 118 between an upper 104 and lower surface 106 of the first ceramic layer 102. It should be recognized that this via 118 need not be completely through the body of the first ceramic layer 102, although it is preferably so. A through-hole via 118 has the advantage of easier and more reliable processing in accordance with the present invention.

The via 118 may be formed in the first ceramic layer 102 by any conventional method. This may include, but is not limited to, mechanical punches, dies, hydraulic pin presses, programmable punches, drills, lasers, etc. In a preferred embodiment, a mechanical punch is used in forming the via 118. Unless, a very narrow via is required, the mechanical punch has the advantage of low cost. In a preferred embodiment, the via 118 is substantially round (circular) in shape and has a diameter of about 0.010" to 0.020". More particularly, the via 118 has a diameter-to-height ratio of about 2. However, it should be recognized that the via 118 may be of any shape or dimension, such as substantially round, rectangular, oblate, extended a slotted. In addition, any further required circuitry feedthroughs or vias may be formed in the first 102 and second ceramic layers 110 at this time.

Figure 5:
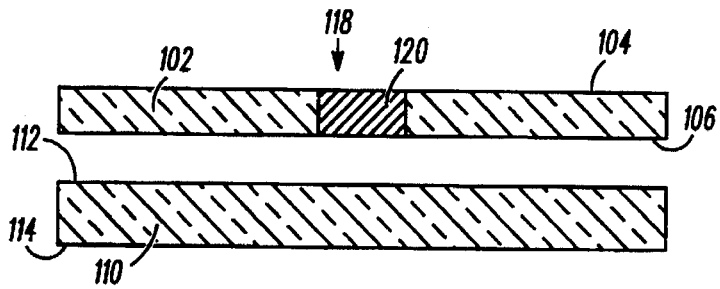

In FIG. 5, the next major process step 206 includes substantially filling the hole or via 118 with metalization 120. In a preferred embodiment, the metalization 120 is applied to the via 118 by a screening process. Screening processes are well known in the art. Other conventional methods may be used with equally good results. Typically, the metalization 120 used is a metal-filled paste. In one embodiment, a low temperature, low resistance metal such as gold, silver or copper can be used to fill the via 118 in (preferably the low sintering temperature glass/ceramic composite) the first ceramic layer 102. In a preferred embodiment, a silver paste such as DuPont 6141 silver paste (available from E.I. DuPont de Nemours and Company of Wilmington, Del.) is used which advantageously permits the green ceramic and silver paste to be cofired. It should be recognized that the ceramic layers 102 and 110 may be screened with selective surface metalization at any time while they are in the green state. In addition, any existing feedthroughs may be filled at this time. Advantageously, this surface metalization may be applied at the same time that the via metalization 120 is applied. More particularly, the upper and lower surface 104 and 106 of the first ceramic layer 102 and a top and bottom surface 112 and 114 of the second ceramic layer 110 may be selectively metalized, to provide necessary circuitry traces and connections. Once the silver paste is applied, it is preferably suitably dried in an oven, for example at about 60° C. (Celcius) for about 1 minute.

Figure 6:
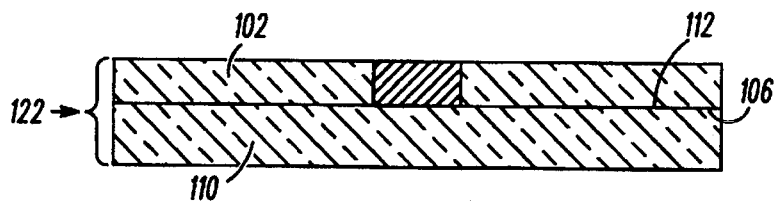

In FIG. 6, the next major process step 208 provides for laminating the ceramic layers 102 and 110 together. In this step, the ceramic layers 102 and 110 are individually placed and co-aligned in a lamination fixture which is processed in a hydraulic press. More particularly, the lower surface 106 of the first ceramic layer 102 is placed and aligned in contact with the top surface 112 of the second ceramic layer 110. In a preferred embodiment, the ceramic layers 102 and 110 are laminated in the press for about 10 minutes at about 70° C. at about 5000 pounds per square inch. This process results in a multilayer green ceramic laminate substrate 122.

Figure 7:
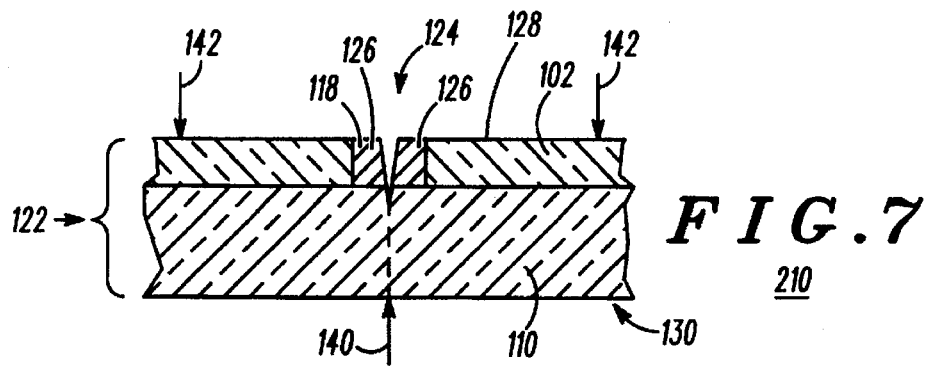

In FIG. 7, the next major process step 210 provides for scoring the ceramic laminate 122 to form a score line 124 extending substantially through the metalized via 118 of the first ceramic layer 102 and into a portion of the second ceramic layer 110. Preferably, the score line 124 completely divides the via 118, forming a split via 126 defining an IO pad. In particular, the score line 124 may extend downwardly about one-third to two-thirds of the way into the laminate 122, preferably about one-half way into the laminate 122 for the reasons detailed herein.

The separate split vias 126 formed during this process 210 provide several advantages. First, since the split vias 126 are separate, it is possible to electrically test individual ceramic devices 100 (as shown in FIG. 8) while they are still in array substrate form. Second, the surface finish of the split vias 126 is defined by the uniform scoring operation 210, not a subsequent cleaving operation 214 which produces uneven metal surfaces. Third, the location of the scoring line 124 is substantially not critical since the split via 126 is defined and isolated during the scoring process 210, not during the unpredictable cleaving process 214 which can produce chips, metal/ceramic stress cracks or fracture propagation deviations. Any chips, cracks or deviations occurring during cleaving will not affect the split via 126 which is previously defined during scoring.

The next major process step 212 involves cofiring or sintering the multilayer ceramic laminate substrate 122 (substantially as shown in FIG. 7). In a preferred embodiment, this step 212 can include: ramping the temperature of the laminate from about 25° C. to about 450° C. in about a nine hour period; holding the laminate at about 450° C. for about one hour; ramping the temperature of the laminate from about 450° C. to about 850° C. in about one and one-half hours; holding the laminate at about 850° C. for about 20 minutes; ramping the temperature of the laminate from about 850° C. to about 650° C. in about one and one-half hours; and ramping the temperature of the laminate from about 650° C. to about 25° C. in about three hours.

The advantage of this relatively low temperature cofiring process is that it allows the laminate 122 to volatize binders and densify properly while minimizing effects due to thermal expansion mismatch between the ceramic and metal components. This cofiring cycle 212 provides a substantially complete densification of the laminate 122. However, it should be understood that other processes could be used to provide an equally suitable substantially cured laminate. The oven used in this process may be a furnace, continuous or other conventional oven known in the art.

As shown in FIG. 8, the last major process step 214 is cleaving the individual ceramic devices 100 from the ceramic laminate substrate 122 along the scored lines 124 (as shown in FIG. 7) to form split vias 126 which define IO pads. Typically, the cleaving is mechanically accomplished using techniques that are well known in the art, such as applying mechanical stress along the scored line 124 causing a fracture to propagate through the second ceramic layer 110 of the laminate 122, thereby singulating the ceramic device 100 from the laminate 122. The cleaving step 214 is facilitated by the scoring step 210 as detailed herein.

More particularly, in FIG. 8, the individual ceramic devices 100 from the ceramic laminate substrate 122 are shown cleaved along the scored lines 124 (as shown in FIG. 7) to form split vias 126 which define I/O pads. Typically, the ceramic devices 100 are cleaved from the laminate 122 by applying a bending force 140 to the lower portion of the laminate 122 directly below the scored line 124 and in opposition to at least one holding force 142 applied at upper portion 128 of the laminate 122 (as depicted in FIG. 7). The bending force 140 is manually applied below the score line 124 to provide mechanical stress along the score line 124 which propagates a substantially vertical fracture through the second ceramic layer 110, thereby singulating the ceramic devices 100 from the laminate 122. The configuration of the cleaving mechanism is well known in the art. It should be recognized that this type of operation may be readily automatable by those skilled in the art.

Figure 9:
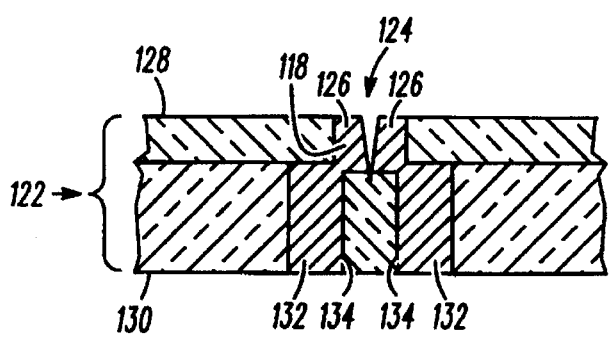
FIG. 9 shows a cross sectional view of one embodiment of the present invention wherein secondary buried vias are directly connected to the split vias and are incorporated to provide internal connections within the ceramic device.
Figure 10:
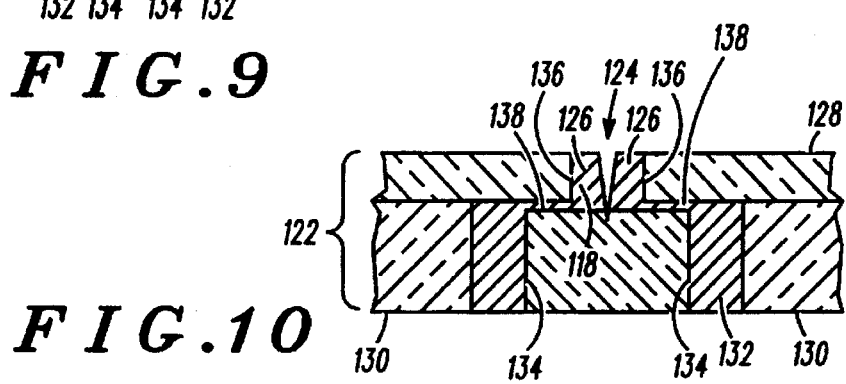
FIG. 10 shows a cross sectional view of another embodiment of the present invention wherein secondary buried vias are indirectly connected to the split vias by a metalized trace to provide internal connections within the ceramic device.

FIGS. 9 and 10 show the ceramic laminate 122 which incorporates ceramic devices with I/O connections in two alternate embodiments. Although it should be recognized that many configurations can be made to connect circuitry to the metalized via 118 which forms the IO pad, in accordance with the present invention.

In the first embodiment shown in FIG. 9, a ceramic laminate 122 with an upper 128 and lower portion 130 defines a thickness of about 0.015". The laminate 122 includes a metalized via 118 that is substantially round in shape and extends downwardly from the upper portion 128 of the laminate 122 approximately 0.005" into the laminate 122. The metalized via 118 may be of any shape or configuration, but in this preferred embodiment is a substantially round via 118 of about 0.010" to 0.020" in diameter. This is because a round via configuration of this size minimizes process costs.

The metalized via 118 includes a score line 124 which extends downwardly substantially through the entire via 118 and into a portion of the ceramic laminate 122. Preferably, the score line 124 completely divides the metalized via 118, forming a split via 126. More particularly, the line 124 may extend downwardly about one-third to two-thirds (0.005" to 0.010") into the laminate 122, preferably one-half way (0.0075") into the laminate 122. The separated split vias 126 provide several advantages. First, since the split vias 126 are separated, it is possible to electrically test individual ceramic devices 100 while they are still in array substrate form. Second, the surface finish of the split vias 126 is defined by the scoring line 124, not a cleaving operation 214 which produces uneven metal surfaces. Third, the location of the score line 124 is not critical since the split via 126 is defined by the score line 124, not an unpredictable cleaving process 214 which can produce chips, metal/ceramic stress cracks or fracture deviations. Any chips, cracks or deviations occurring during cleaving will not affect the split via 126.

In addition, at least one buried metalized second via 132, offset from and connecting to the metalized via 118, is provided. This second via 132 is substantially round in shape and extends upwardly from the lower portion 130 of the ceramic laminate 122 approximately 0.010" into the laminate 122 and connects to the metalized via 118. The second via 132 may be of any shape or configuration, but in this embodiment a substantially round via 132 of about 0.010" to 0.020" in diameter is preferred, to minimize process costs. An edge 134 of the second via 132 is offset a minimum of about 0.005" from the score line 124 so that the metalized via 118 and second via 132 are substantially directly connected. This has the advantage of providing a low resistance connection. Further, in this embodiment it is found that during the cleaving process 214 the ceramic laminate 122 splits cleanly and smoothly without fracturing through the nearby edge 134 of the second via 132 (as shown in FIG. 8). This is due to the uniform mechanical property exhibited by the ceramic of the laminate 122.

In another alternative embodiment, shown in FIG. 10, at least one buried metalized second via 132, offset from and connected to the metalized via 118 by a connecting trace 134, is provided. The second via 132 is substantially round in shape and extends upwardly from the lower portion 130 of the ceramic laminate 122 approximately 0.010" into the laminate 122. As detailed above, the second via 132 may be of any shape or configuration, but in this embodiment a substantially round via 132 of about 0.010" to 0.020" in diameter is preferred, to minimize process costs. An edge 134 of the second via 132 is offset and positioned substantially further than an edge 136 of the metalized via 118, and a selectively metalized connecting trace 138 is provided which electrically connects the metalized via 118 to the second via 132. This has the advantage of providing a circuit designer some flexibility in the way the IO pads are connected in a ceramic device 100 (as demonstrated in FIG. 8). In this embodiment it is also found that during the cleaving process 214 the ceramic laminate 122 splits cleanly and smoothly without fracturing through the second via 132 due to the uniform mechanical property exhibited by the ceramic of the laminate 122.

The advantage of the method of producing input/output connections 200 in a ceramic device 100 and apparatus produced thereby is that: it may be fully accomplished by existing high capacity mechanical techniques and equipment; it is low cost, known, predictable, robust and provides uniform surfaces, which in turn provides for higher quality processing; it provides low resistance wraparound and side metalization in a ceramic device; and it allows testing of individual ceramic devices while they are in a substrate array form.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A method of making input/output connector pads for a ceramic device, comprising the steps of:
   providing a first ceramic layer in a green state and having a predetermined thickness defined by an upper and a lower surface and a second ceramic layer in a green state and having a predetermined height defined by a top and bottom surface;
   forming at least one first via through the first ceramic layer and at least one second via through the second ceramic layer, the at least one second via being offset from and connecting to the first via;
   substantially filling the first and the at least one second via with metalization;
   laminating the lower surface of the first ceramic layer to the top surface of the second ceramic layer to form a laminate;
   scoring the laminate along at least one line, the line extending downwardly through the first via of the first ceramic layer and into a portion of the second ceramic layer such that the line does not intersect the at least one second via;
   cofiring the ceramic layers and the metalization; and
   cleaving the laminate along the line, whereby a fracture propagates through the second ceramic layer separating the laminate such that the fracture does not propagate into the at least one second via.

2. The method of claim 1, wherein the laminating step includes:
   substantially aligning and placing the first ceramic layer on the second ceramic layer to form a laminate whereby the second vias are offset from the first via; and
   pressing the laminate together at about 70° C. at about 5000 pounds per square inch for about 10 minutes.

3. The method of claim 1, wherein the providing step includes selecting the thickness of the first ceramic layer to be about equal to or less than the height of the second ceramic layer.

4. The method of claim 1, wherein the cleaving step includes having the line extend from about one-third to two-thirds through the laminate depth.

5. The method of claim 4, wherein the cleaving step includes having the line extend about one-half way through the laminate depth.

6. The method of claim 1, wherein the providing step includes selecting the first and second ceramic layers comprising a relatively low cofiring temperature glass-ceramic composition.

7. The method of claim 6, wherein the cofiring step includes:
   ramping the temperature of the laminate from about 25° C. to about 450° C. in a nine hour period;
   holding the laminate at about 450° C. for about one hour;
   ramping the temperature of the laminate from about 450° C. to about 850° C. in about one and one-half hours;
   holding the laminate at about 850° C. for about 20 minutes;
   ramping the temperature of the laminate from about 850° C. to about 650° C. in about one and one-half hours; and
   ramping the temperature of the laminate from about 650° C. to about 25° C. in about three hours.

* * * * *